US010276628B2

(12) United States Patent
Gancarz et al.

(10) Patent No.: US 10,276,628 B2
(45) Date of Patent: Apr. 30, 2019

(54) TIME-OF-FIGHT PIXEL INCLUDING IN-PIXEL BURIED CHANNEL TRANSISTORS

(71) Applicant: ams Sensors Singapore Pte. Ltd., Singapore (SG)

(72) Inventors: Radoslaw Marcin Gancarz, Adliswil (CH); Daniel Furrer, Uetikon am See (CH); Miguel Bruno Vaello Paños, Zurich (CH); Stephan Beer, Schaffhausen (CH)

(73) Assignee: ams Sensors Singapore Pte. Ltd., Singapore (SG)

( * ) Notice: Subject to any disclaimer, the term of this patent is extended or adjusted under 35 U.S.C. 154(b) by 139 days.

(21) Appl. No.: 15/596,136

(22) Filed: May 16, 2017

(65) Prior Publication Data

US 2017/0338274 A1    Nov. 23, 2017

Related U.S. Application Data

(60) Provisional application No. 62/337,486, filed on May 17, 2016.

(51) Int. Cl.

| G01S 17/89 | (2006.01) |
|---|---|
| H01L 27/148 | (2006.01) |
| H01L 27/146 | (2006.01) |
| H04N 13/207 | (2018.01) |
| H04N 13/254 | (2018.01) |

(Continued)

(52) U.S. Cl.
CPC ...... *H01L 27/14831* (2013.01); *G01S 7/4863* (2013.01); *G01S 7/4915* (2013.01); *G01S 17/89* (2013.01); *H01L 27/14616* (2013.01); *H01L 27/14623* (2013.01); *H04N 5/374* (2013.01); *H04N 5/378* (2013.01); *H04N 5/3745* (2013.01); *H04N 13/207* (2018.05); *H04N 13/254* (2018.05); *H04N 13/271* (2018.05)

(58) Field of Classification Search
CPC ..... G01S 17/89; G01S 17/92; H01L 27/14614
See application file for complete search history.

(56) References Cited

U.S. PATENT DOCUMENTS

| 5,471,515 A | 11/1995 | Fossum et al. |
|---|---|---|
| 8,760,549 B2 | 6/2014 | Lehmann et al. |

(Continued)

*Primary Examiner* — Thanh Luu
(74) *Attorney, Agent, or Firm* — Fish & Richardson P.C.

(57) ABSTRACT

An imaging device, including a monolithic semiconductor integrated circuit substrate, comprises a focal plane array of pixel cells. Each one of the pixel cells includes a gate overlying a region of the substrate operable to convert incident radiation into charge carriers. The pixel also includes a CMOS readout circuit including at least one output transistor in the substrate. The pixel further includes a charge coupled device section on the substrate adjacent the gate, the charge coupled device section including a sense node to receive charge carriers transferred from the region of the substrate beneath the gate. The sense node is coupled to the output transistor. The pixel also includes a reset switch coupled to the sense node. The pixel's charge coupled device section has a buried channel region. The pixel also includes one or more bias enabling switches operable to enable a bias voltage to be applied to the gate. At least one of the reset switch or the one or more bias enabling switches is formed in the buried channel region.

17 Claims, 3 Drawing Sheets

(51) Int. Cl.
*H04N 13/271* (2018.01)
*G01S 7/486* (2006.01)
*G01S 7/491* (2006.01)
*H04N 5/374* (2011.01)
*H04N 5/3745* (2011.01)
*H04N 5/378* (2011.01)

(56) References Cited

U.S. PATENT DOCUMENTS

| | | |
|---|---|---|
| 8,803,967 B2 | 8/2014 | Oggier et al. |
| 8,829,408 B2 | 9/2014 | Oggier et al. |
| 9,000,349 B1 | 4/2015 | Lehmann et al. |
| 9,343,607 B2 | 5/2016 | Buettgen et al. |
| 9,442,196 B2 | 9/2016 | Buettgen et al. |
| 2011/0037969 A1* | 2/2011 | Spickermann ........ G01S 7/4863 356/5.01 |

* cited by examiner

TIME-OF-FIGHT PIXEL INCLUDING IN-PIXEL BURIED CHANNEL TRANSISTORS

FIELD OF THE DISCLOSURE

The present disclosure relates to demodulation pixels that include one or more in-pixel buried channel transistors.

BACKGROUND

Electronic imaging sensors sometimes have an array of (m×n) photo-sensitive pixels, with x≥1 rows and y≥1 columns. Each pixel of the array can individually be addressed by dedicated readout circuitry for column-wise and row-wise selection. A block for signal post-processing may be integrated on the sensor. The pixels can have various basic functions including: photo detection, signal processing, information storage, and analog or digital conversion. Demodulation pixels are a particular class of pixels that can be employed for three-dimensional (3D) imaging and time-of-flight (TOF) applications.

SUMMARY

The present disclosure describes demodulation pixels that include one or more in-pixel buried channel transistors.

For example, in one aspect, an imaging device, including a monolithic semiconductor integrated circuit substrate, comprises a focal plane array of pixel cells. Each one of the pixel cells includes a gate overlying a region of the substrate operable to convert incident radiation into charge carriers. The pixel also includes a CMOS readout circuit including at least one output transistor in the substrate. The pixel further includes a charge coupled device section on the substrate adjacent the gate, the charge coupled device section including a sense node to receive charge carriers transferred from the region of the substrate beneath the gate. The sense node is coupled to the output transistor. The pixel also includes a reset switch coupled to the sense node. The pixel's charge coupled device section has a buried channel region. The pixel also includes one or more bias enabling switches operable to enable a bias voltage to be applied to the gate. At least one of the reset switch or the one or more bias enabling switches is formed in the buried channel region.

In another aspect, an imaging device, including a monolithic semiconductor integrated circuit substrate, comprises a focal plane array of pixel cells. Each one of the pixel cells includes an integration gate overlying the substrate for accumulating photo-generated charge in an underlying portion of the substrate, a CMOS readout circuit including at least one output transistor in the substrate, and a charge coupled device section on the substrate adjacent the integration gate. The charge coupled device section includes a sense node connected to the output transistor, and includes at least one charge coupled device for transferring charge from the underlying portion of the substrate to the sensing node. The charge coupled device section has a buried channel region. Each pixel further includes a reset switch coupled to the sense node, and one or more bias enabling switches operable to enable a bias voltage to be applied to the integration gate. The reset switch and/or the one or more bias enabling switches are formed in the buried channel region.

Some implementations include one or more of the following features. For example, the buried channel region can be a buried channel implant region. In some cases, the reset switch and each of the one or more bias enabling switches is formed in the buried channel region and are implemented as buried channel transistors (sometimes referred to as depletion mode transistors), which can offer an efficient way to provide in-pixel, low-voltage-drop switches. Thus, the reset switch and the one or more bias enabling switches can be implemented, for example, as a NMOS FET buried channel transistors having threshold voltages no greater than zero volts.

In another aspect, the present disclosure describes a time of flight camera system that includes a modulated light source and an imaging sensor including a two-dimensional array of demodulation pixels. The imaging sensor is operable to detect light generated by the modulated light source and reflected by an object. In addition to other features, each demodulation pixel includes a reset switch and one or more bias enabling switches formed in a buried channel region (e.g., as buried channel transistors).

The disclosure also describes a method of operation for the pixels, which can be used advantageously, for example, in TOF and other applications.

Other aspects, features and advantages will be readily apparent from the following detailed description, the accompanying drawings, and the claims.

DETAILED DESCRIPTION

Figure 1:
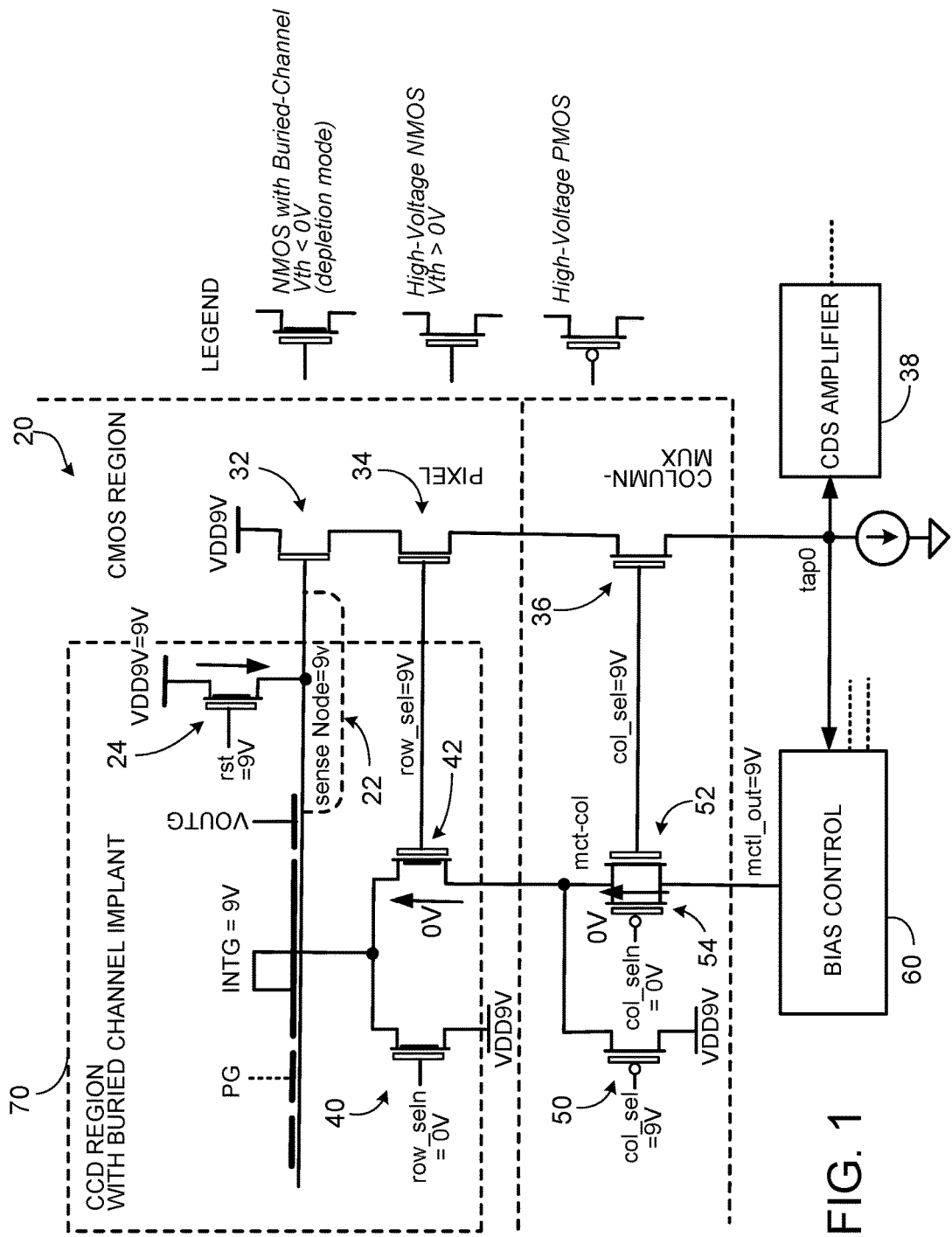
FIG. 1 is a simplified schematic of a TOF demodulation pixel including in-pixel buried channel transistors.

FIG. 1 illustrates a simplified schematic of a pixel cell 20 of a focal plane array of many such cells formed in an integrated circuit. As show in FIG. 1, the pixel 20 includes one or more photogates PG. The region beneath the photogate(s) can be referred to as the active or photosensitive region of the pixel 20. Radiation incident on the active region is converted into charge carriers. In some cases, the pixel 20 includes an integration gate INTG outside the active region that serves as a storage node for storing charge carriers generated in the active region. The pixel 20 also can include an isolation gate OUTG, as well as a floating diffusion region 22 that serves as a sense node. The isolation gate OUTG, when present, serves to decouple the sense region 22 from the integration region.

The gates PG, INTG, OUTG and the sense diffusion region 22 can be arranged, for example, above or beneath a gate-oxide layer on a semiconductor substrate (e.g., bulk Si or p-doped Si). A shield layer composed, for example, of metal can protect the various elements other than the photogate(s) PG from incident light. The shield layer includes an opening in the active region such that the photogate(s) can be exposed to the incident light passing through the opening. By applying proper voltages to the gates, charge carriers generated by the incident light are transported to the storage node beneath the integration gate INTG where they are integrated over a certain exposure time.

The pixel 20 further includes a reset switch 24 and an output circuit implemented as a source follower field-effect transistor (FET) 32. The sense node 22 is connected to the gate of the source follower FET 32, whose drain is connected to a drain supply voltage (VDD). The source follower FET 32 is connected to a readout circuit 30 that, in the illustrated example, includes a row select FET 34, a column select FET 36 and a correlated double sampling (CDS) amplifier 38, which is operable to provide a correlated double sampling of the potential of the sense node 22. Other readout circuits may be used in some implementations.

A voltage can be applied to the integration gate INTG through switches 42, 52, 54 to control transfer of the charge carriers from the storage node beneath the integration gate INTG to the sense node 22. Thus, for example, during the integration stage, charge carriers are kept back in the integration well beneath the integration gate INTG and only after exposure are they transferred to the sense node 22.

At the end of an integration period, the surface potential beneath the sense node 22 is reset by applying a reset signal (rst) to the gate of the rest switch 24. After the gate of the reset switch 24 is returned to its initial potential, the readout circuit samples the potential of the sense node 22. After sampling the initial reset voltage, the charge underneath the integration gate INTG can be transferred. After the charge is transferred to the sense node 22, the new potential of the sense node 22 is sensed at the source of the source follower FET 26.

The pixel 20 further includes switches 40, 42, 50, 52, 54 that are operable to enable a particular voltage (i.e., bias) from a bias control circuit 60 to be applied to the pixel's integration gate INTG based on row and column selection signals applied to the respective gates of the switches 40, 42, 50, 52, 54. In the illustrate example, the gate of switch 42 receives a row selection signal row_sel, whereas the gate of switch 40 receives the inverted row selection signal row_seln. Likewise, the gates of switches 50, 52 receive a column selection signal col_sel, whereas the gate of the switch 54 receives the inverted column selection signal col_seln.

The drains of the switches 40, 42 are coupled to the integration gate INTG, the source of the switch 40 is coupled to the voltage supply (VDD), and the source of the switch 42 is coupled to the drains of the switches 50, 52, 54. The source of the switch 50 is coupled to the voltage supply (VDD), and the sources of the switches 52, 54 are coupled to the bias control circuit 60.

The pixel 20 can be implemented, for example, in silicon using an industry standard complementary metal oxide semiconductor (CMOS) fabrication process. However, the portion of the semiconductor substrate that forms the pixels' active region, storage node and sense node has a buried channel implant that facilitates charge transfer for these charge coupled devices (CCDs). As explained in greater detail below, the in-pixel buried channel implant region (indicated by the dashed line 70 in FIG. 1) extends so that it encompasses the respective areas of the semiconductor substrate that form the reset switch 24 and the bias enable switches 40, 42.

Each of the pixel's FETs and switches can be implemented, for example, as a MOSFET. In the illustrated example, the source follower FET 32, row select FET 34, column select FET 36 and bias enable switch 52 are implemented as high-voltage NMOS transistors having a threshold voltage (Vth) greater than zero volts. Likewise, in the illustrated example, the bias enable switches 50 and 54 are implemented as high-voltage PMOS FETs.

On the other hand, in order to improve the voltage swing at the storage node beneath the integration gate INTG and the voltage swing at the floating diffusion node 22 (i.e., the sense node), the reset switch 24 and the bias enable switches 40, 42 can be implemented as buried channel transistors (e.g., NMOS FETs) such that they have threshold voltages, Vth, less than zero volts.

Extending the pixel's buried channel region to include the area of the bias enable switches 40, 42 can increase the voltage swing on the integration gate INTG. In particular, by extending the buried channel region in this manner, the voltage drop across the bias enable switch 40 can be reduced from a positive value (Vth) to zero or less than zero volts, which allows the maximum voltage applied to the integration date INTG to reach VDD (e.g., 9 volts) rather than the somewhat lower value of (VDD–Vth). The higher voltage swing at the storage node can improve ambient light suppression so that background noise caused by sunlight or other ambient light can be reduced.

Extending the pixel's buried channel region to include the area of the reset switch 24 can increase the voltage swing on the at the floating diffusion (i.e., the sense node) 22. In particular, by extending the buried channel region in this manner, the voltage drop across the reset switch 24 can be reduced from a positive value (Vth) to zero or less than zero volts, which allows the maximum voltage applied to the sense node to reach VDD (e.g., 9 volts) rather than the somewhat lower value of (VDD–Vth). The higher voltage swing at the sense node can improve the pixel's signal-to-noise ratio (SNR).

Figure 2:
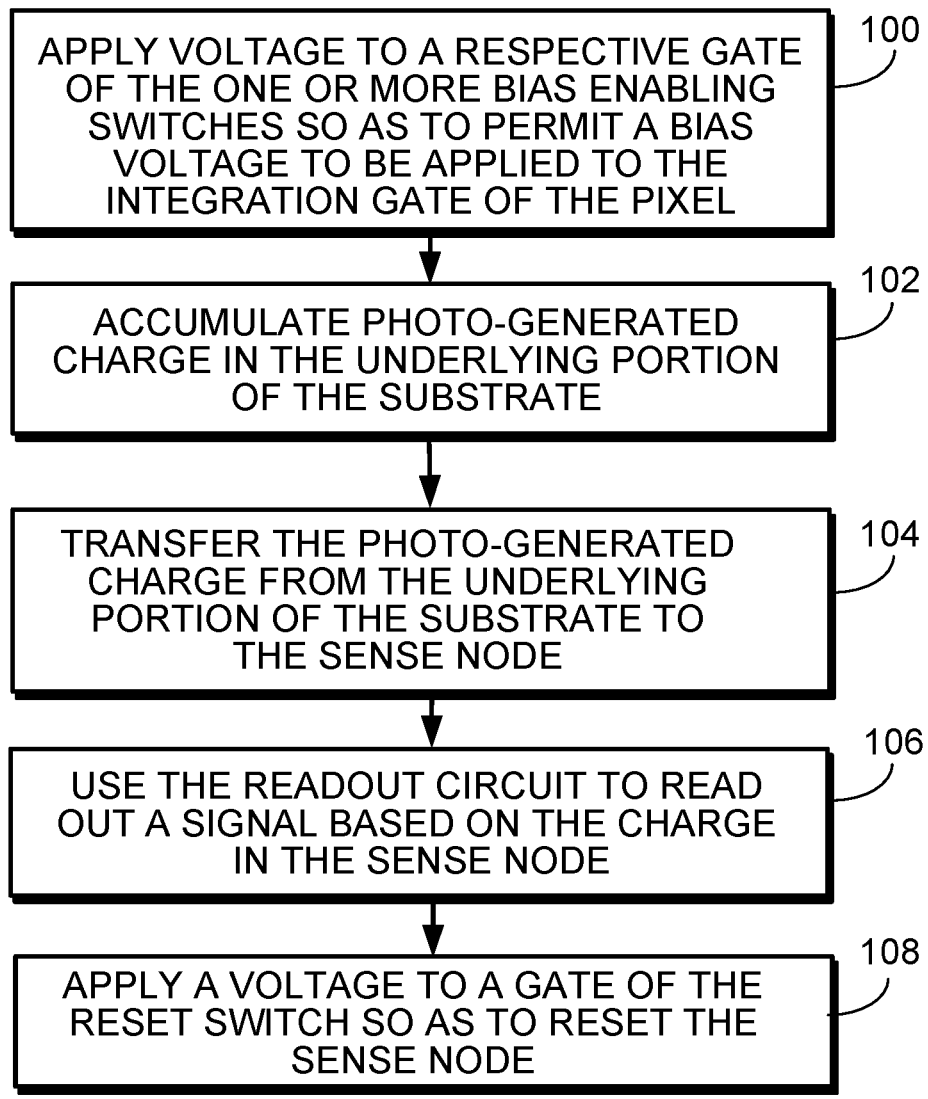
FIG. 2 illustrates steps in a method of operating the pixel.

As indicated by FIG. 2, operation of the pixel 20 thus can include applying a voltage to a respective gate of the one or more bias enabling buried channel transistors 40, 42 so as to permit a bias voltage to be applied to the integration gate INTG of the pixel (100); accumulating photo-generated charge in the underlying portion of the substrate (102); transferring the photo-generated charge from the underlying portion of the substrate to the sense node 22 (104); using the readout circuit 32, 34, 36 to read out a signal based on the charge in the sense node 22 (106); and applying a voltage to a gate of the reset buried channel transistor 24 so as to reset the sense node 22 (108). In some instances, reset is held until transferring the charge at 104. Thus, additional operations may be performed, for example, between 102 and 104, as well as elsewhere in the process.

Figure 3:
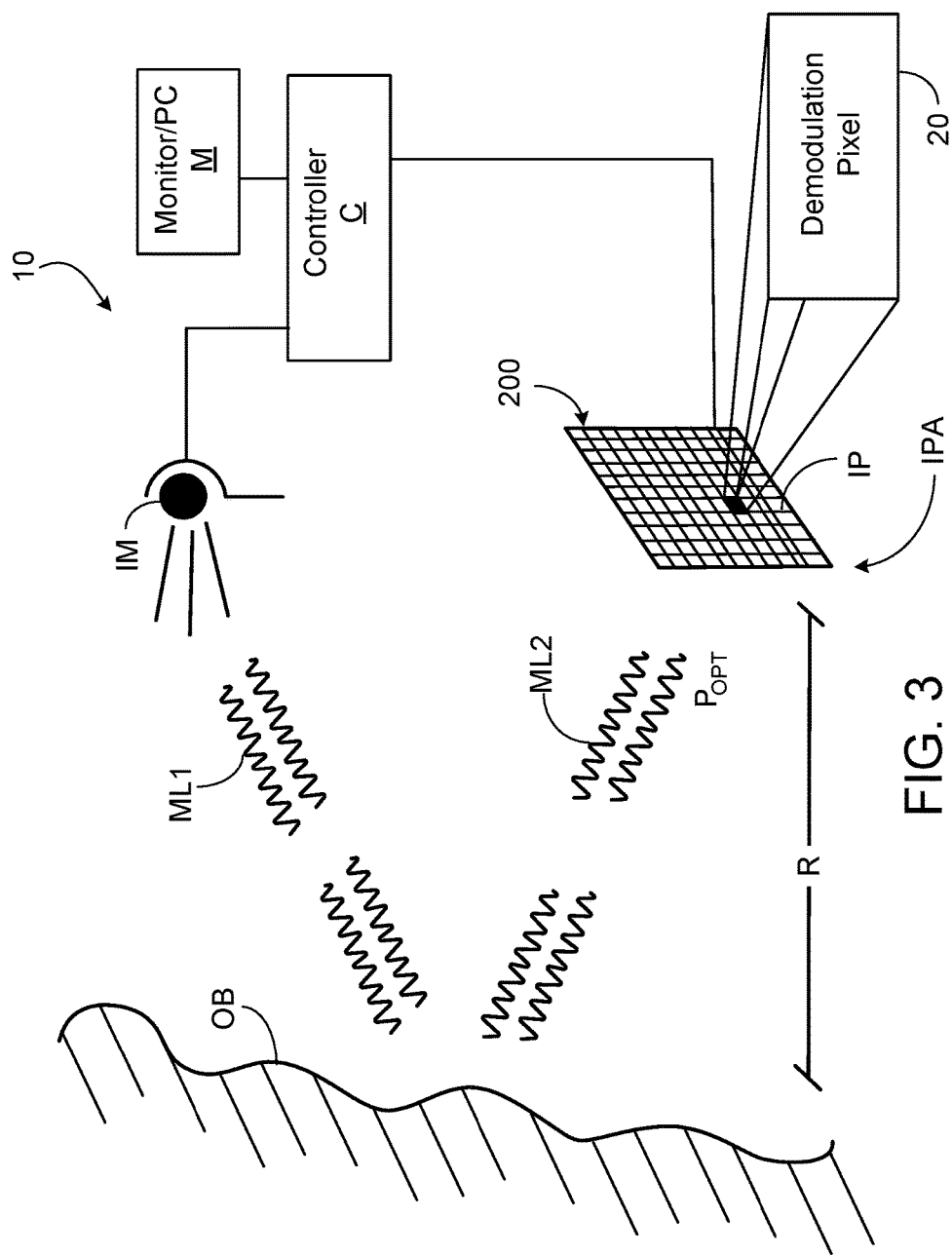
FIG. 3 is a block diagram of a three-dimensional camera system based on a sensor that includes an array of demodulation TOF pixels as in FIG. 1.

FIG. 3 illustrates the basic principle of a 3D-measurement camera system based on a sensor 200 comprising an array of demodulation pixels 20 each of which can be similar to the demodulation pixel of FIG. 1.

Modulated illumination light ML1 from an illumination module or light source IM is sent to the object OB of a scene. In some instances, the light source generates modulated infra-red (IR) radiation. A fraction of the total optical power sent out is reflected to the camera 10 and detected by the 3D imaging sensor 200. The sensor 200 comprises a two dimensional pixel matrix of the demodulation pixels 20. Each pixel 20 is capable of demodulating the impinging light signal ML2 using known techniques. A control board CB is operable to regulate the timing of the camera 10. The phase values of all pixels correspond to the particular distance information of the corresponding point in the scene. The two-dimension gray scale image with the distance information is converted into a three-dimensional (e.g., depth) image by image processor IP. The image can be displayed to a user, for example, via display D or used as a machine vision input.

The distance R for each pixel can be calculated by R=(c·TOF)/2, with 'c' as light velocity and TOF corresponding to the time-of-flight. Either pulse intensity-modulated or continuously intensity-modulated light is sent out by the illumination module or light source IM, reflected by the object and detected by the sensor. With each pixel 20 of the sensor 200 being capable of demodulating the optical signal at the same time, the sensor is able to deliver 3D images in real-time, i.e., frame rates of up to 30 Hertz (Hz), or even more, are possible. In pulse operation, the demodulation would deliver the time-of-flight directly. However, continuous sine modulation delivers the phase delay (P) between the emitted signal and the received signal, also corresponding directly to the distance $R=(P \cdot c)/(4 \cdot pi \cdot fmod)$, where fmod is the modulation frequency of the optical signal. Typical state-of-the-art modulation frequencies range from a few MHz up to a few hundreds of MHz or even GHz.

Various modifications can be made within the spirit of the foregoing disclosure. Accordingly, other implementations are within the scope of the claims.

What is claimed is:

1. An imaging device including a monolithic semiconductor integrated circuit substrate, the imaging device comprising a focal plane array of pixel cells, each one of the pixel cells comprising:
   a gate overlying a region of the substrate operable to convert incident radiation into charge carriers;
   a CMOS readout circuit including at least one output transistor in the substrate;
   a charge coupled device section on the substrate adjacent the gate, the charge coupled device section including a sense node to receive charge carriers transferred from the region of the substrate beneath the gate, wherein the sense node is coupled to the output transistor, and wherein the charge coupled device section has a buried channel region;
   a reset switch coupled to the sense node; and
   one or more bias enabling switches operable to enable a bias voltage to be applied to the gate,
   wherein at least one of the reset switch or the one or more bias enabling switches is formed in the buried channel region.

2. The imaging device of claim 1 wherein the reset switch is a buried channel transistor.

3. The imaging device of claim 2 wherein the reset switch is a NMOS FET.

4. The imaging device of claim 2 wherein the reset switch is a buried channel transistor having a threshold voltage no greater than zero volts.

5. The imaging device of claim 1 wherein each of the one or more bias enabling switches is a buried channel transistor.

6. The imaging device of claim 5 wherein each of the one or more bias enabling switches is a NMOS FET.

7. The imaging device of claim 5 wherein each of the one or more bias enabling switches is a buried channel transistor having a threshold voltage no greater than zero volts.

8. The imaging device of claim 1 wherein the reset switch and each of the one or more bias enabling switches is formed in the buried channel region.

9. The imaging device of claim 8 wherein each of the reset switch and the one or more bias enabling switches includes a buried channel transistor.

10. The imaging device of claim 8 wherein each of the reset switch and the one or more bias enabling switches is a NMOS FET having a threshold voltage no greater than zero volts.

11. The imaging device of claim 1 wherein the buried channel region is a buried channel implant region.

12. A time of flight camera system comprising:
    a modulated light source;
    an imaging sensor including a two-dimensional array of demodulation pixels, the imaging sensor operable to detect light generated by the modulated light source and reflected by an object, wherein each demodulation pixel comprises:
      an integration gate overlying the substrate for accumulating photo-generated charge in an underlying portion of the substrate;
      a CMOS readout circuit including at least one output transistor in the substrate;
      a charge coupled device section on the substrate adjacent the integration gate, the charge coupled device section including a sense node connected to the output transistor, and including at least one charge coupled device for transferring charge from the underlying portion of the substrate to the sensing node, wherein the charge coupled device section has a buried channel region;
      a reset switch coupled to the sense node; and
      one or more bias enabling switches operable to enable a bias voltage to be applied to the integration gate,
      wherein the reset switch and the one or more bias enabling switches are formed in the buried channel region.

13. The time of flight camera system of claim 12 further including a processor operable to convert a two-dimensional gray scale image, based on output signals from the demodulation pixels, to a three-dimensional image.

14. The time of flight camera system of claim 12 wherein each of the reset switch and the one or more bias enabling switches is a buried channel transistor.

15. The time of flight camera system of claim 12 wherein each of the reset switch and the one or more bias enabling switches is a NMOS FET having a threshold voltage no greater than zero volts.

16. The time of flight camera system of claim 12 wherein the buried channel region is a buried channel implant region.

17. A method of operating a demodulation pixel that includes: an integration gate overlying the substrate for accumulating photo-generated charge in an underlying portion of the substrate; a CMOS readout circuit including at least one output transistor in the substrate; a charge coupled device section on the substrate adjacent the integration gate, the charge coupled device section including a sense node connected to the output transistor, and including at least one charge coupled device for transferring charge from the underlying portion of the substrate to the sensing node, wherein the charge coupled device section has a buried channel region; a reset switch coupled to the sense node; and one or more bias enabling switches operable to enable a bias voltage to be applied to the integration gate, wherein at least one of the reset switch or the one or more bias enabling switches is a buried channel transistor in the buried channel region,
   the method comprising:
     applying a voltage to a respective gate of the one or more bias enabling switches so as to permit a bias voltage to be applied to the integration gate of the pixel;
     accumulating photo-generated charge in the underlying portion of the substrate;
     transferring the photo-generated charge from the underlying portion of the substrate to the sensing node;
     using the readout circuit to read out a signal based on the charge in the sense node; and
     applying a voltage to a gate of the reset switch so as to reset the sense node.

* * * * *